United States Patent

Toshio et al.

[15] 3,659,162

[45] Apr. 25, 1972

[54] SEMICONDUCTOR INTEGRATED CIRCUIT DEVICE HAVING IMPROVED WIRING LAYER STRUCTURE

[72] Inventors: Wada Toshio; Nakanuma Sho, both of Tokyo, Japan

[73] Assignee: Nippon Electric Company, Lt., Tokyo, Japan

[22] Filed: Dec. 19, 1969

[21] Appl. No.: 886,444

[30] Foreign Application Priority Data

Dec. 27, 1968 Japan....................................44/818
Dec. 27, 1968 Japan....................................44/819
Apr. 1, 1969 Japan....................................44/25331

[52] U.S. Cl. ...................317/235 R, 317/234 N, 317/235 D, 317/235 E, 317/235 F, 317/235 AT

[51] Int. Cl. ........................................H01l 19/00

[58] Field of Search...........317/234 N, 235 D, 235 E, 235 F, 317/235 AT

[56] References Cited

UNITED STATES PATENTS

| | | | |
|---|---|---|---|
| 3,475,661 | 10/1969 | Iwata et al. | 317/234 |
| 3,483,446 | 12/1969 | Least | 317/235 |
| 3,380,153 | 4/1968 | Hushs et al | 317/235 X |

OTHER PUBLICATIONS

IBM Tech. Disclosure Bulletin - Augusta et al. Vol. 8, No. 12 May 1966 p. 1843

*Primary Examiner*—John W. Huckert
*Assistant Examiner*—William D. Larkins
*Attorney*—Sandoe, Hopgood and Calimafde

[57] ABSTRACT

A semiconductor integrated circuit is disclosed having at least one buried layer formed of a high impurity concentration buried layer or a conductive film formed beneath the epitaxial single crystal and polycrystal regions.

2 Claims, 9 Drawing Figures

Patented April 25, 1972 3,659,162

5 Sheets-Sheet 1

*INVENTORS*
Toshio Wada
Sho Nakanuma
*by*
Sandoe, Hopgood & Calimafde
ATTORNEYS

*INVENTORS*
Toshio Wada
Sho Nakanuma
by
Sandoe, Hopgood & Calimafde
ATTORNEYS

Patented April 25, 1972 3,659,162

5 Sheets-Sheet 5

INVENTORS
Toshio Wada
Sho Nakanuma
by
Sandoe, Hopgood & Calimafde
ATTORNEYS

*INVENTORS*
Toshio Wada
Sho Nakanuma
*by*
Sandoe, Hopgood & Calimafde
ATTORNEYS

INVENTORS
Toshio Wada
Sho Nakajima
by
Sandoe, Hopgood & Calimafde
ATTORNEYS

SEMICONDUCTOR INTEGRATED CIRCUIT DEVICE HAVING IMPROVED WIRING LAYER STRUCTURE

This invention relates generally to semiconductor integrated circuits and, more particularly, to integrated circuits of the kind having the wiring layers in mutually different planes on the semiconductor substrate.

A conventional semiconductor integrated circuit device comprises a semiconductor substrate of one conductivity type and a plurality of single crystal regions of the opposite conductivity type epitaxially grown on the major surface of the substrate, with an isolation region interposed therebetween. A diffusion region of the one conductivity type is selectively formed in each of the epitaxial regions to constitute a base region and another diffusion region of the opposite conductivity type is selectively formed in each of the diffusion regions of the one conductivity type to constitute an emitter region. An insulative film covers the entire surface of the epitaxial regions except for openings formed on the surface portions of the diffusion regions, and wiring means are kept in ohmic contact through these openings with the surface portions of the diffusion regions which constitute the emitter and collector regions. The isolation region is usually formed of a separate diffusion region of the one conductivity type or a polycrystal region. The former is well known to those skilled in the art, and the latter is described in the December, 1968 issue of a Japanese periodical entitled "Electronics," at pages 1 through 5.

In the structure of the conventional integrated circuit device of this kind, a complicated cross-over structure is necessary to realize the large-scale integrated circuit device. Complicated wiring means reduces the speed of response of the device and has an adverse effect on the external noise factor and reliability of the device. Moreover, the complicated wiring means requires a complicated manufacturing process which makes the device costly to manufacture.

In addition, the diffusion regions in the known integrated circuit devices respectively serving as the emitter, base, and collector regions have their electrodes formed on their surface portions. It is difficult therefore in these devices to reduce the surface area and to satisfactory miniaturize the completed device.

It is an object of the present invention to provide an integrated circuit device of high reliability, which is realizable by a simplified manufacturing process and which has a simplified wiring structure.

In accord with the present invention, a semiconductor integrated circuit device is provided that is characterized by at least one buried wiring layer formed of a high impurity concentration buried layer or a conductive film, formed beneath the epitaxial single crystal and polycrystal regions. Since the buried wiring layers do not occupy the surface portion of the device, miniaturization of the device is facilitated without complicating the wiring means on the surface of the device. In other words, since the total surface area of the epitaxial regions is reduced by a half in the device of this invention, a higher degree of integration can be obtained.

To the accomplishment of the above and to such further objects as may hereinafter appear, the present invention relates to a semiconductor integrated circuit device as defined in the appended claims, and as described in the following specifications taken together with the accompanying drawings, in which:

Figure 2:
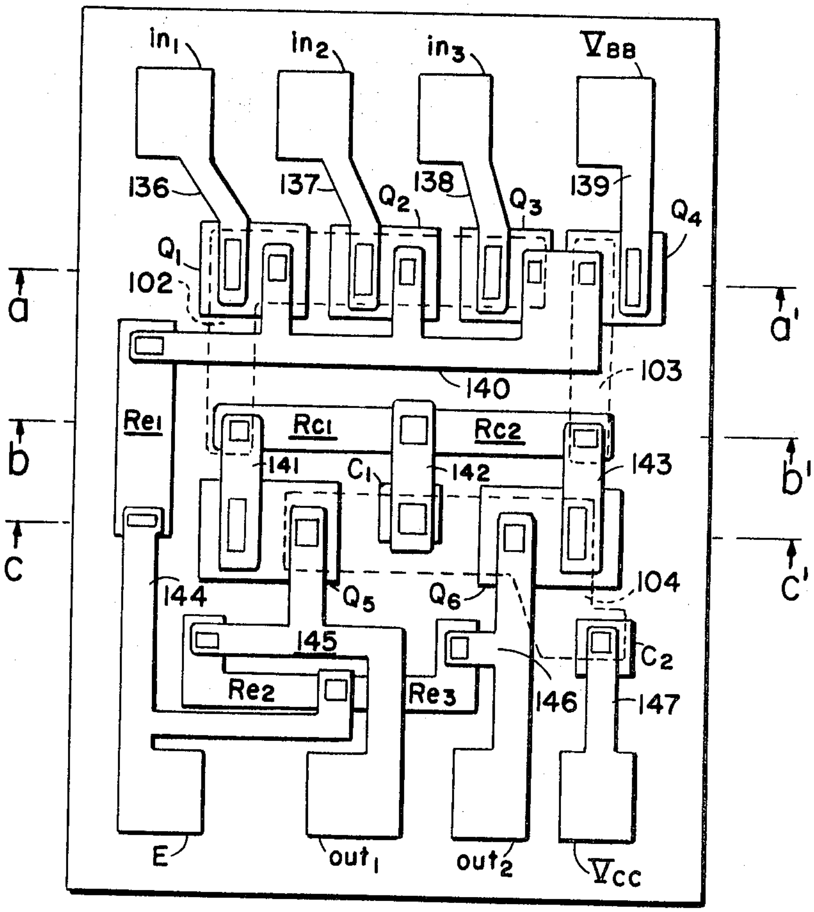
FIG. 2 is a plan view of an integrated circuit according to one embodiment of the invention.
Figure 6:
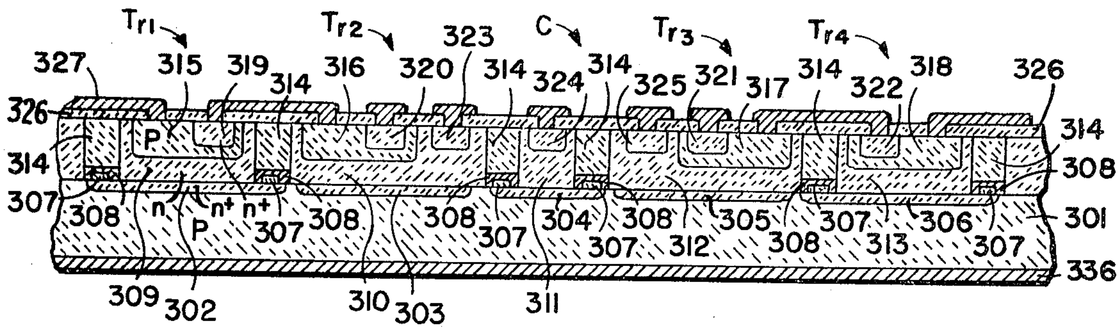
Figure 4:
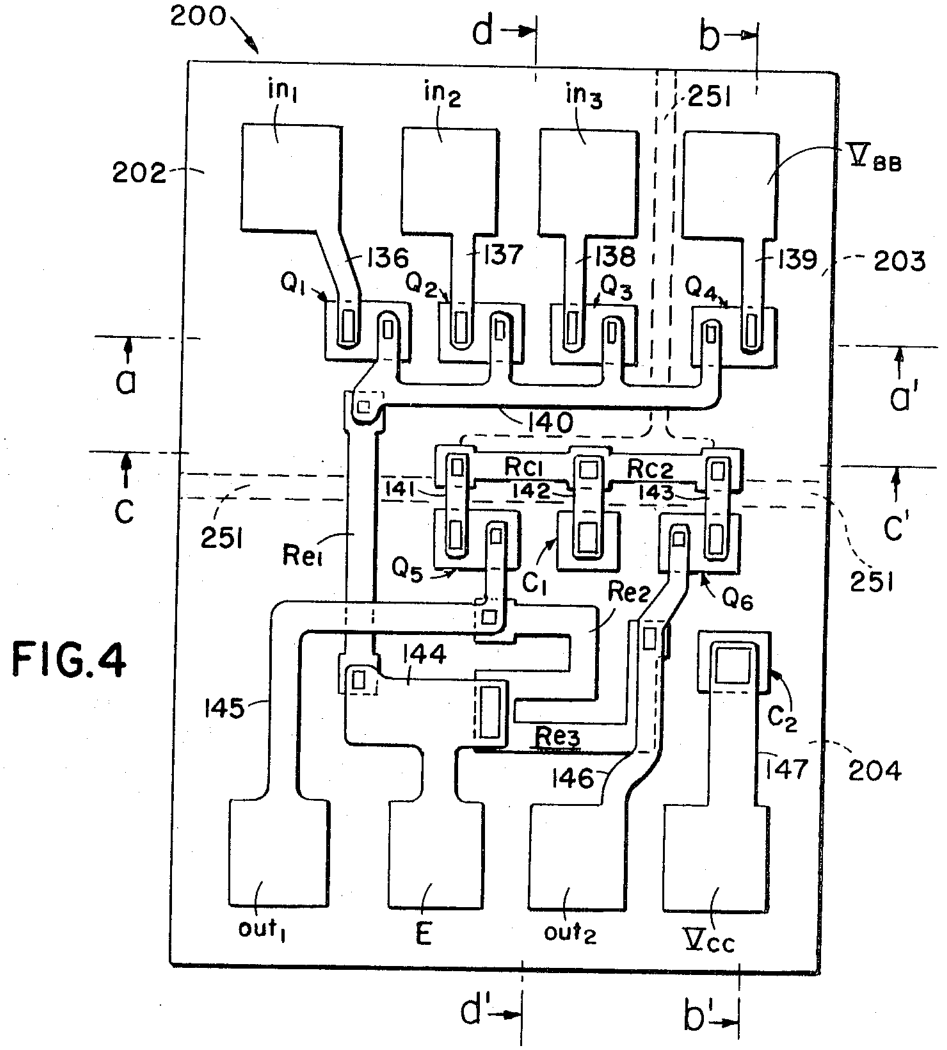
Figure 7:
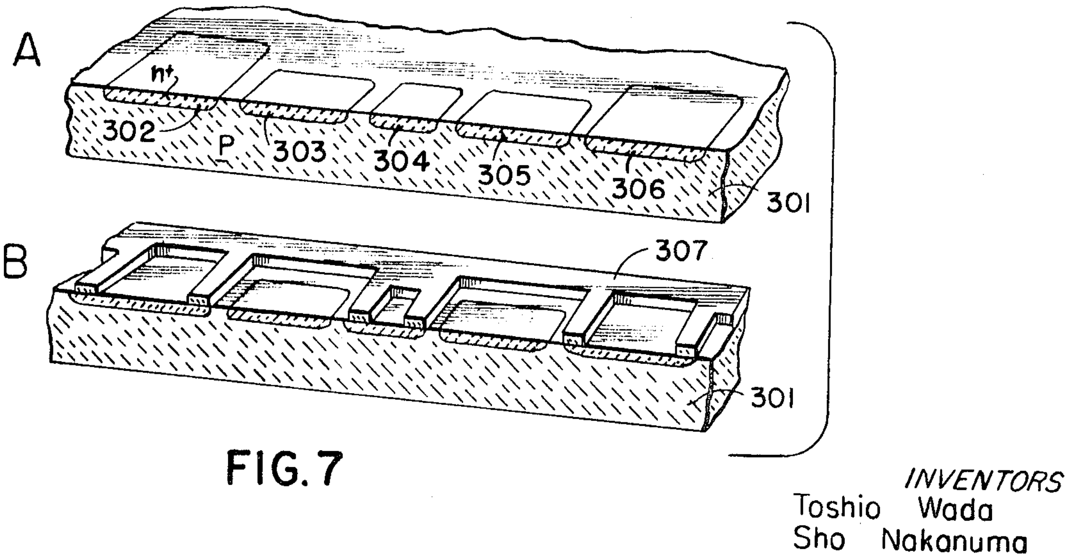
Figure 8:
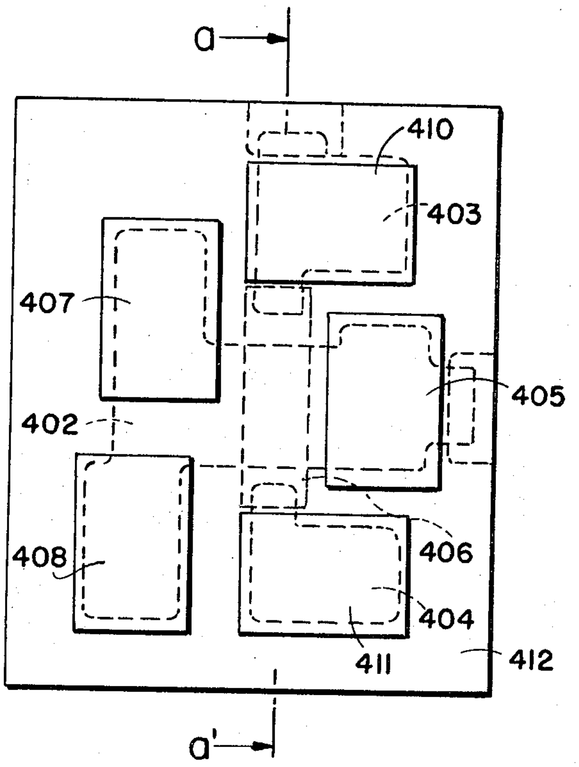
Figure 9:
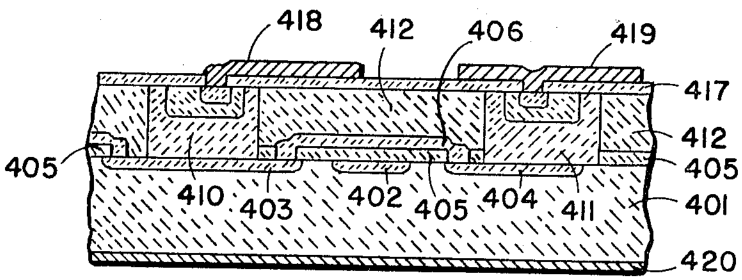

FIGS. 3A, B and C are respectively cross-sectional views taken along the lines *a—a'*, *b—b'* and *c—c'* in FIG. 2;

FIG. 4 is a plan view of an integrated circuit according to another embodiment of the invention;

FIGS. 5A, B, C and D are respectively cross-sectional views taken along lines *a—a'*, *b—b'*, *c—c'*, and *d—d'* in FIG. 4;

FIG. 6 is a cross-sectional view of an integrated circuit according to still another embodiment of the invention;

FIGS. 7 A and B are perspective views of a part of the embodiment shown in FIG. 6;

fig. 8 is a schematic plan view of an integrated circuit according to a further embodiment of the present invention; and FIG. 9 is a cross-sectional view taken along line *a—a'* in FIG. 8.

Figure 1:
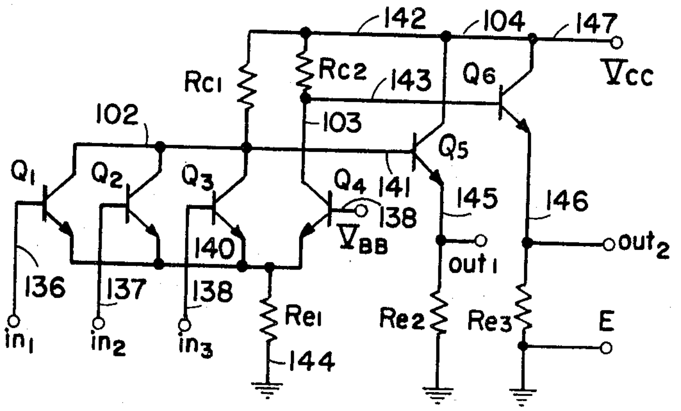
FIG. 1 is a circuit diagram of an example of an electrical circuit that may be fabricated in the form of a semiconductor integrated circuit according to the present invention.

Referring to FIG. 1, the circuit to be translated into the integrated circuit device of the present invention is shown in the form of a three-input OR/NOR circuit. This circuit produces at an output terminal $out_1$ a NOR output of three inputs supplied at input terminals $in_1$, $in_2$ and $in_3$, and an OR output at another output terminal $out_2$. Since the structure and function of this circuit are well known among those skilled in the art, no further description of that circuit is given in this specification.

Continuing to refer to FIG. 1 and referring to FIG. 2 in which like components are denoted by like reference numerals, transistors $Q_1$, $Q_2$, $Q_3$ and $Q_4$ are arranged in a row in the upper section of the device, while transistors $Q_5$ and $Q_6$ are disposed in the lower section of the device. The emitter regions of transistors $Q_1 - Q_4$ are connected in common by a surface wiring layer 140, to one of the terminals of a resistor region $Re_1$. On the other hand, the base regions of transistors $Q_1 - Q_3$ are connected to input terminals $in_1$ to $in_3$ respectively through surface wiring layers 136 to 138, and the base region of transistor $Q_4$ is connected to a constant voltage power source terminal $V_{BB}$ through a surface wiring layer 139. The collector regions of transistors $Q_1 - Q_3$ are coupled in common by a buried wiring layer 102 to one of the terminals of a resistor region $R_{c1}$. The collector of transistor $Q_4$ is likewise coupled to a terminal of resistor region $R_{c2}$ through buried wiring layer 103, and to the base region of transistor $Q_6$ through a surface wiring layer 143. The buried wiring layer 102 connected to the one terminal of resistor $R_{c1}$ is also connected to the base region of transistor $Q_5$ through a surface wiring layer 141. Transistors $Q_5$ and $Q_6$ are connected at their collectors by a buried wiring layer 104, to which the junction of resistor regions $R_{c1}$ and $R_{c2}$ is connected through surface wiring layer 142 and a surface-buried layer connecting means $C_1$. The emitters of transistors $Q_5$ and $Q_6$ are coupled to output terminals $out_1$ and $out_2$ and resistor regions $R_{e2}$ and $R_{e3}$ respectively through surface wiring layers 145 and 146. The junction of resistor regions $R_{e2}$ and $R_{e3}$ is coupled to the ground terminal E through a surface wiring layer 144. The other terminal of resistor region $R_{e1}$ is also connected to terminal E through surface wiring layer 144. The buried wiring layer 104 for connecting the collectors of transistors $Q_5$ and $Q_6$ is coupled to a power supply terminal $V_{CC}$ through a surface-buried layer connecting means $C_2$ and a surface wiring layer 147.

As will be seen from FIGS. 1 and 2, those portions 102, 103 and 104 of the circuit of FIG. 1, which are shown by the thick solid lines in FIG. 1 and the dotted lines in FIG. 2, are formed by buried wiring layers.

Referring now to FIGS. 3A, B, and C the integrated circuit comprises a P-type silicon single crystal substrate 101 of approximately 90 ohm-cm in resistivity. High impurity concentration N-type regions 102, 103 and 104 are formed on the major surface of substrate 101 by selectively diffusing an N-type impurity such as arsenic into the substrate. The depth of this diffusion may be 3 microns and the sheet resistivity of the diffusion regions may be 5 ohm/□ . The surface of substrate 101 is then completely covered with a 0.5-micron-thick silicon dioxide film which is then selectively removed to leave only those portions 105 on which the polycrystal isolation regions are to be grown.

By means of a vapor-phase growth technique, polycrystal isolation regions 106 are formed on portions 105 of the silicon dioxide film. At the same time, epitaxial single crystal regions 107 – 115 are grown on the buried N-type regions 102, 103, and 104, in the state mutually isolated from one another by polycrystal isolation regions 106. The epitaxial single crystal regions 107 – 115 have a resistivity of about 0.5 ohm-cm and are each approximately 7 microns in thickness.

Figure 3:
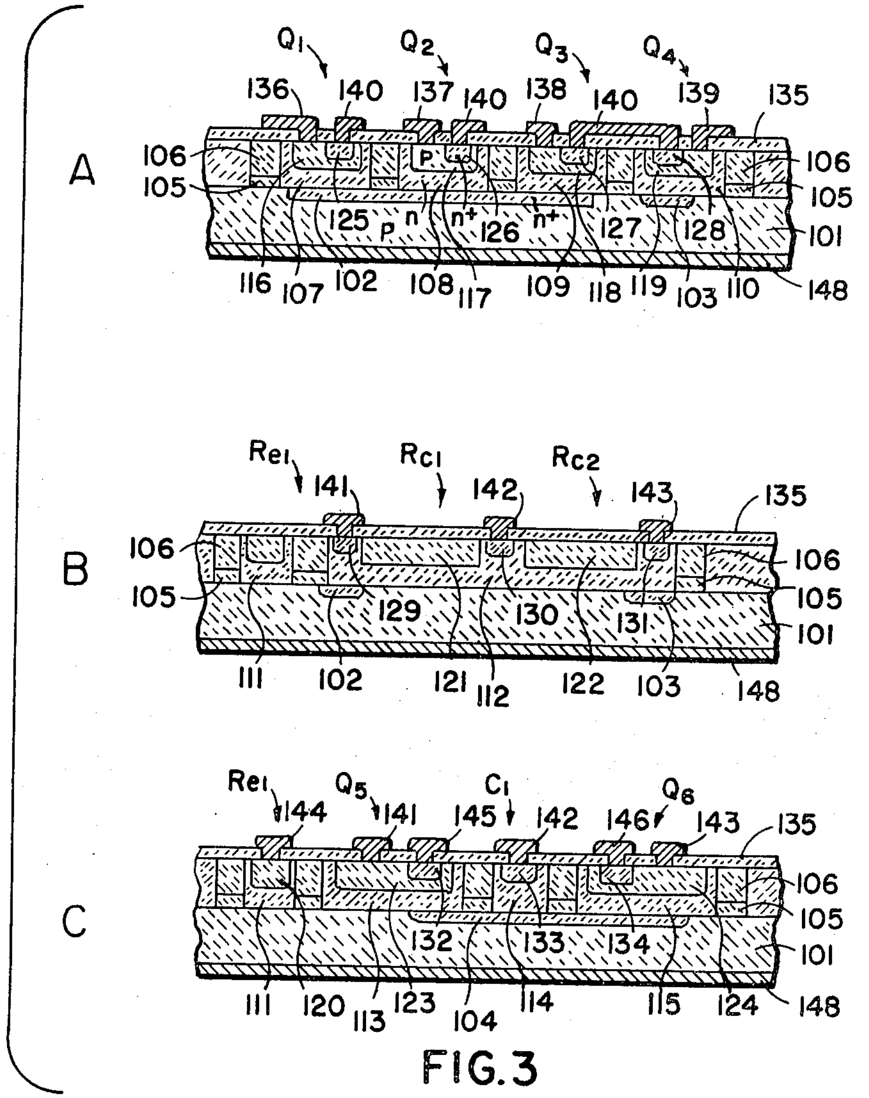

A P-type impurity such as boron is selectively diffused into each of regions 107 – 115 to form P-type regions 116 – 120, 123 and 124, which are to constitute the base regions for the transistors formed in regions 107 – 115. Furthermore, an N-type impurity such as phosphorus is selectively diffused into each of the P-type regions 116, 117, 118, 119, 123 and 124, to form N-type regions 125, 126, 127, 128, 132 and 134 which are to serve as the emitter regions for the transistors. The P-type regions 121 and 122 into which the N-type impurities are not diffused serve as bulk resistor regions $R_{c1}$ and $R_{c2}$. To provide outlet terminals for these resistor regions $R_{c1}$ and $R_{c2}$, high impurity concentration N-type regions 129, 130 and 131 are formed in the epitaxial region 112 with the resistor regions $R_{c1}$ and $R_{c2}$ interposed therebetween (FIG. 3B). Likewise, a highly doped N-type region 133 (FIG. 3C) is formed in epitaxial region 114 to provide the surface-buried layer connecting means $C_1$. Although not shown in FIGS. 3 A, B and C, other resistor regions $R_{e1}$, $R_{e2}$ and $R_{e3}$ are formed in a similar manner.

After completion of the diffusion regions and bulk resistor regions through a series of the foregoing steps, the surface of the substrate is completely covered with a silicon dioxide film 135 which is then selectively removed to form openings in the diffusion regions. Surface wiring strips 136 – 146 are then formed. A conductor film 148 is attached to the bottom surface of substrate 101 to complete the integrated circuit device.

In the integrated circuit described above, the highly doped N-type buried layers 102, 103 and 104 serve by themselves as the buried wiring layers 102, 103 and 104, to respectively interconnect the collector regions of transistors $Q_1$ –$Q_6$. If a lower collector circuit resistance is desired, conductor wiring strips may be formed along with the highly doped N-type buried layers.

A second embodiment of the invention is shown in FIG. 4 and has such a conductor layer at the level of the highly doped N-type buried layer in addition thereto. Since the plan view of FIG. 4 is quite similar to FIG. 2, further description will not be given of FIG. 4.

Figure 5:
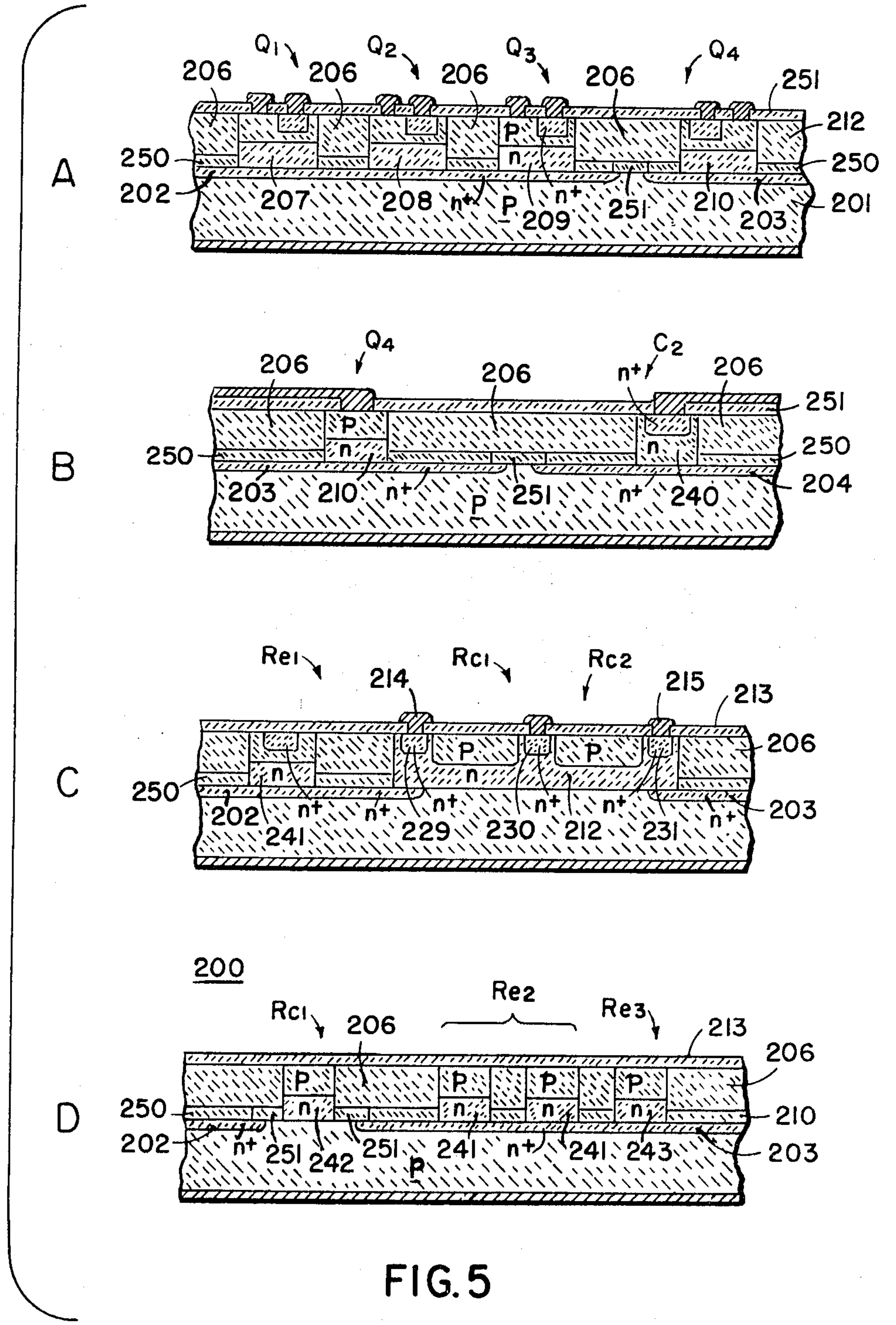

Continuing, however, to refer to FIG. 4 and to FIGS. 5 A, B, C and D, the device of this embodiment has three highly doped N-type regions 202, 203 and 204 on the major surface of the silicon single crystal substrate 201. The surface of substrate 201 is then completely covered with a conductive tantalum nitride film 250, which is then selectively etched away at those portions which correspond to epitaxially grown single crystal regions 207 – 210, 240, 241, 212, 242 and 243. Also, to conform the pattern of film 250 to the three highly doped N-type buried regions 202, 203 and 204, a 2-micron-wide tantalum oxide strip 251 is formed in the film 250, through an anodization process.

Epitaxial single crystal regions 207 – 210, 240, 241, 212, 242, and 243 are then grown on the substrate 201 through the openings in tantalum nitride film 250. Polycrystal regions 206 are also formed surrounding the epitaxial regions for purposes of isolation.

As in the first embodiment of FIG. 2, the epitaxial single crystal regions are thus formed. Selective diffusion of P-type impurities into each of the epitaxial regions follows the foregoing steps and then N-type impurities are diffused in selected ones of the P-type regions, thereby to form base and emitter regions in respective epitaxial regions. Since those diffusion processes and succeeding steps are the same as those employed in the first embodiment, further description of these steps will not be given.

Since the tantalum nitride film 250 serves to further reduce the resistance in the collector circuit, by as much as half in the optimum case, the integrated circuit of the second embodiment is well suited for an integrated circuit device designed for high frequency or high speed operation.

Referring now to FIGS. 6 and 7 A and B, there is shown an integrated circuit according to a third embodiment of the present invention which comprises a P-type silicon single crystal substrate 301. Highly doped N-type buried regions 302 – 306 are formed on the major surface of the substrate 301, and a 1-micron-thick platinum silicide layer 307 is kept in ohmic contact with selected ones of the buried regions. Layer 307 may be formed by a vapor-phase growth technique or a sputtering technique. Layer 307 is then covered with a silicon dioxide film 308 of approximately 3,000 A. in thickness, through a vapor-phase growth or RF sputtering technique and polycrystal isolation regions 314 are then formed on the silicon dioxide film 308. In a state surrounded by the silicon dioxide film 308, single crystal regions 309 – 313 are epitaxially grown on substrate 301.

As in the first and second embodiments, P-type impurities are selectively diffused into each of the epitaxial regions 309 – 313 to form P-type diffusion regions 315 – 318 each constituting a base region. N-type regions 319, 320, 321 and 322 are selectively formed in these P-type diffusion regions for constituting emitter regions. N-type impurities are diffused into those portions of the epitaxial regions 310 and 312 which are not occupied by the P-type diffusion regions 316 and 317 to form highly doped N-type regions 323 and 325. A highly doped N-type region 324 is similarly formed in epitaxial region 311. After the foregoing process is completed, the surface of the epitaxial regions and isolation regions are entirely covered with an insulator film 326, in which openings are selectively formed for admitting wiring strips extending to the surface of the diffusion regions. In this manner transistors $T_{r1}$, $T_{r2}$, $T_{r3}$ and $T_{r4}$ and surface-buried layer connecting means C are formed.

As will be seen from FIGS. 6, 7 A and B, the collector regions of transistors $T_{r1}$ and $T_{r4}$ are connected in common to the surface-buried layer connecting means C by buried wiring layer 307, while the emitter regions 319 and 322 of transistors $T_{r1}$ and $T_{r4}$ are respectively connected to base regions 316 and 317 of transistors $T_{r2}$ and $T_{r3}$ by surface wiring layer 327. The collector regions 310 and 312 are respectively connected to the surface wiring strip for external connection. It is apparent that buried wiring layer 307 makes it possible to reduce the surface area of transistors $T_{r1}$ – $T_{r4}$ and thus to reduce the parasitic capacitance between wirings and diffusion regions. It is thus possible even with this embodiment to realize a higher degree of integration.

In this embodiment, buried layer 307 may be formed on buried highly doped regions 303 and 305 as well as on regions 302, 304 and 306. In such a case, an insulative film must first be formed covering the surface of regions 303 and 305.

While platinum silicide has been described for use in forming the buried wiring layer 307 it may be replaced by tungsten, chromium, molybdenum or their silicides. Similarly, titanium, titanium nitride, tantalum, tantalum nitride, and zirconium, which are easily oxidized on their surfaces by anodization, may be suited for wiring layer 307, because insulative layer 308 is easily formed thereon by oxidization.

Referring to FIG. 8 and FIG. 9, there is shown an integrated circuit according to a fourth embodiment of the invention which has a wiring cross-over at the buried layer level. In this embodiment, highly doped N-type buried layers 402, 403 and 404 of approximately 5 ohm/□ in sheet resistivity are formed in the major surface of a P-type silicon single crystal substrate 401. After the buried layers are formed, substrate 401 is completely covered with a silicon dioxide film 405. Openings are then selectively formed in film 405 to allow a platinum silicide wiring 406 to penetrate therethrough for connecting the buried layer 403 to buried layer 404. The wiring layer 406 forms a cross-over with the buried wiring 402, with silicon dioxide film 405 being interposed therebetween. Layer 406, having a thickness 0.5 to 1.0 micron, may be formed by sputtering and a succeeding photoetching process. Epitaxial regions 408 – 411 are then grown through a vapor-phase growth process, and after the vapor-phase growth process is completed, the device is entirely covered with a silicon dioxide film 417, and surface wiring strips 418 and 419 extending respectively to the diffused regions through the apertures are then formed in film 417. A metal film 420 is attached to the bottom of the substrate 401 to complete the integrated circuit device with buried wiring means cross-over.

The advantage of the integrated circuit of the fourth embodiment lies in the fact that undesirable autodoping from buried layer 402 is avoided because layer 402 is covered with insulator film 405 and metal wiring layer 406. It is apparent that the buried cross-over structure further simplifies the surface wiring structure.

In the foregoing preferred embodiments and their modifications, the vapor-phase growth of the epitaxial regions may be performed resorting to the thermal decomposition of the reaction gas containing monosilane $SiH_4$ and a small quantity of phosphine $PH_3$.

The polycrystalline isolation regions may be replaced by diffused single crystal isolation regions extending from the surface of the substrate to the buried wiring layers. If polycrystal isolation regions are employed, gold or iron diffusion into such regions would help improve the breakdown voltage. If the substrate is made of germanium, copper and nickel would serve the same purpose.

The embodiments of the invention herein shown can be adapted to high frequency operation by deepening the diffusion of the P-type impurities into the epitaxial region so that the marginal bent portions of the PN junctions may extend to the polycrystal isolation regions to substantially flatten the effective parts of the PN junctions. In this regard, detailed description is given in a patent application filed on date herewith, Ser. No. 886,886, now abandoned entitled Diffusion - Type Semiconductor Device, in the name of T. Wada et al., and assigned to the assignee of the present application.

As will be seen from the foregoing, the buried wiring layer structure of the present invention makes it possible to reduce the surface area of the integrated circuit device and thus to realize a higher degree of integration and higher density of integrated circuit elements. Therefore, a higher breakdown voltage and smaller stray capacity can be obtained between the wiring layers in the device of the present invention.

While the invention has so far been explained in conjunction with a few embodiments and their modifications, it is to be understood that the description is made merely by way of example and is not intended to be a limitation of the scope of the invention.

We claim:

1. A semiconductor integrated circuit device comprising a semiconductor single crystal substrate of one conductivity type, first, second and third buried conductive layers formed on said substrate, a first insulator film formed on said substrate overlying one of said buried layers and having openings therein at the locations of the other two of said buried layers, a first wiring layer disposed over said first insulator film and passing through said openings to electrically connect said two other of said buried layers, a plurality of single crystal regions of opposite conductivity type epitaxially grown on said substrate, each of said epitaxial regions having at least one diffusion region of said one conductivity type formed therein to constitute an elementary semiconductor device, a polycrystal isolation region in direct contact with said epitaxial regions for electrically isolating said epitaxial regions from one another, said polycrystal isolation region being disposed over said first wiring layer, a second insulator film covering the surface of said single crystal at those portions immediately above said diffusion regions and a second surface wiring layer in ohmic contact with said diffusion regions through said openings, one of said buried conductive layers being effective to electrically connect at least two of said epitaxial regions together at their bottom.

2. The semiconductor integrated circuit device claimed in claim 1, in which said buried conductive layers are each formed of a highly doped layer of said opposite conductivity type.

* * * * *

UNITED STATES PATENT OFFICE
CERTIFICATE OF CORRECTION

Patent No. 3,659,162 Dated April 25, 1972

Inventor(s) Toshio Wada and Sho Nakanuma

It is certified that error appears in the above-identified patent and that said Letters Patent are hereby corrected as shown below:

IN THE TITLE PAGE CONTAINING THE ABSTRACT:

"Toshio et al." should have been --Wada et al.--.

The inventors should have been indicated as

--Inventors: Toshio Wada; Sho Nakanuma, both of Tokyo, Japan--

Signed and sealed this 29th day of August 1972.

(SEAL)
Attest:

EDWARD M.FLETCHER,JR.
Attesting Officer

ROBERT GOTTSCHALK
Commissioner of Patents